(12) United States Patent
Cruse et al.

(10) Patent No.: US 8,721,798 B2
(45) Date of Patent: May 13, 2014

(54) METHODS FOR PROCESSING SUBSTRATES IN PROCESS SYSTEMS HAVING SHARED RESOURCES

(75) Inventors: James P. Cruse, Santa Cruz, CA (US); Dermot Cantwell, Sunnyvale, CA (US); Ming Xu, San Jose, CA (US); Charles Hardy, San Jose, CA (US); Benjamin Schwarz, San Jose, CA (US); Kenneth S. Collins, San Jose, CA (US); Andrew Nguyen, San Jose, CA (US); Zhifeng Sui, Fremont, CA (US); Evans Lee, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 554 days.

(21) Appl. No.: 12/916,462

(22) Filed: Oct. 29, 2010

(65) Prior Publication Data

US 2011/0266256 A1    Nov. 3, 2011

Related U.S. Application Data

(60) Provisional application No. 61/330,021, filed on Apr. 30, 2010.

(51) Int. Cl.
*B08B 6/00* (2006.01)
*C25F 5/00* (2006.01)

(52) U.S. Cl.
USPC ............ 134/1.3; 134/22.1; 438/905; 438/907

(58) Field of Classification Search
USPC ............ 134/1.1, 22.1, 42; 438/706, 710, 905, 438/907
See application file for complete search history.

(56) References Cited

U.S. PATENT DOCUMENTS

| | | | | |
|---|---|---|---|---|
| 6,228,773 | B1 * | 5/2001 | Cox | 438/707 |
| 2006/0189134 | A1 * | 8/2006 | Cotte et al. | 438/687 |

OTHER PUBLICATIONS

U.S. Appl. No. 12/915,240, filed Oct. 29, 2010, Cruse.

* cited by examiner

*Primary Examiner* — Saeed T Chaudhry
(74) *Attorney, Agent, or Firm* — Moser Taboada; Alan Taboada

(57) ABSTRACT

Methods for processing substrates in twin chamber processing systems having first and second process chambers and shared processing resources are provided herein. In some embodiments, a method may include providing a substrate to the first process chamber of the twin chamber processing system, wherein the first process chamber has a first processing volume that is independent from a second processing volume of the second process chamber; providing one or more processing resources from the shared processing resources to only the first processing volume of the first process chamber; and performing a process on the substrate in the first process chamber.

16 Claims, 4 Drawing Sheets

METHODS FOR PROCESSING SUBSTRATES IN PROCESS SYSTEMS HAVING SHARED RESOURCES

CROSS-REFERENCE TO RELATED APPLICATIONS

This application claims benefit of U.S. provisional patent application Ser. No. 61/330,021, filed Apr. 30, 2010, which is herein incorporated by reference.

FIELD

Embodiments of the present invention generally relate to substrate processing systems.

BACKGROUND

In order to increase productivity and reduce cost of ownership, substrate processing systems have been developed that process multiple substrate simultaneously. This has been done conventionally by using process chambers that can process multiple substrates in a common volume. However, the inventors have discovered that uniformity issues may arise when using multiple substrates in a common volume that do not arise in single substrate processing systems. In addition, the inventors have observed that conventional single substrate processing systems are unable to satisfactorily share chamber resources, thereby frustrating attempts to reduce the cost of ownership and increase process throughput.

Accordingly, the inventors have provided methods for processing substrates in twin chamber processing systems using shared chamber resources.

SUMMARY

Methods for processing substrates in twin chamber processing systems having first and second process chambers and shared processing resources are provided herein. In some embodiments, a method may include providing a substrate to the first process chamber of the twin chamber processing system, wherein the first process chamber has a first processing volume that is independent from a second processing volume of the second process chamber; providing one or more processing resources from the shared processing resources to only the first processing volume of the first process chamber; and performing a process on the substrate in the first process chamber.

In some embodiments, a computer readable medium may be provided, having instructions stored thereon which, when executed, causes a twin chamber processing system having a first process chamber, a second process chamber, and shared processing resources to perform any of the methods disclosed herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
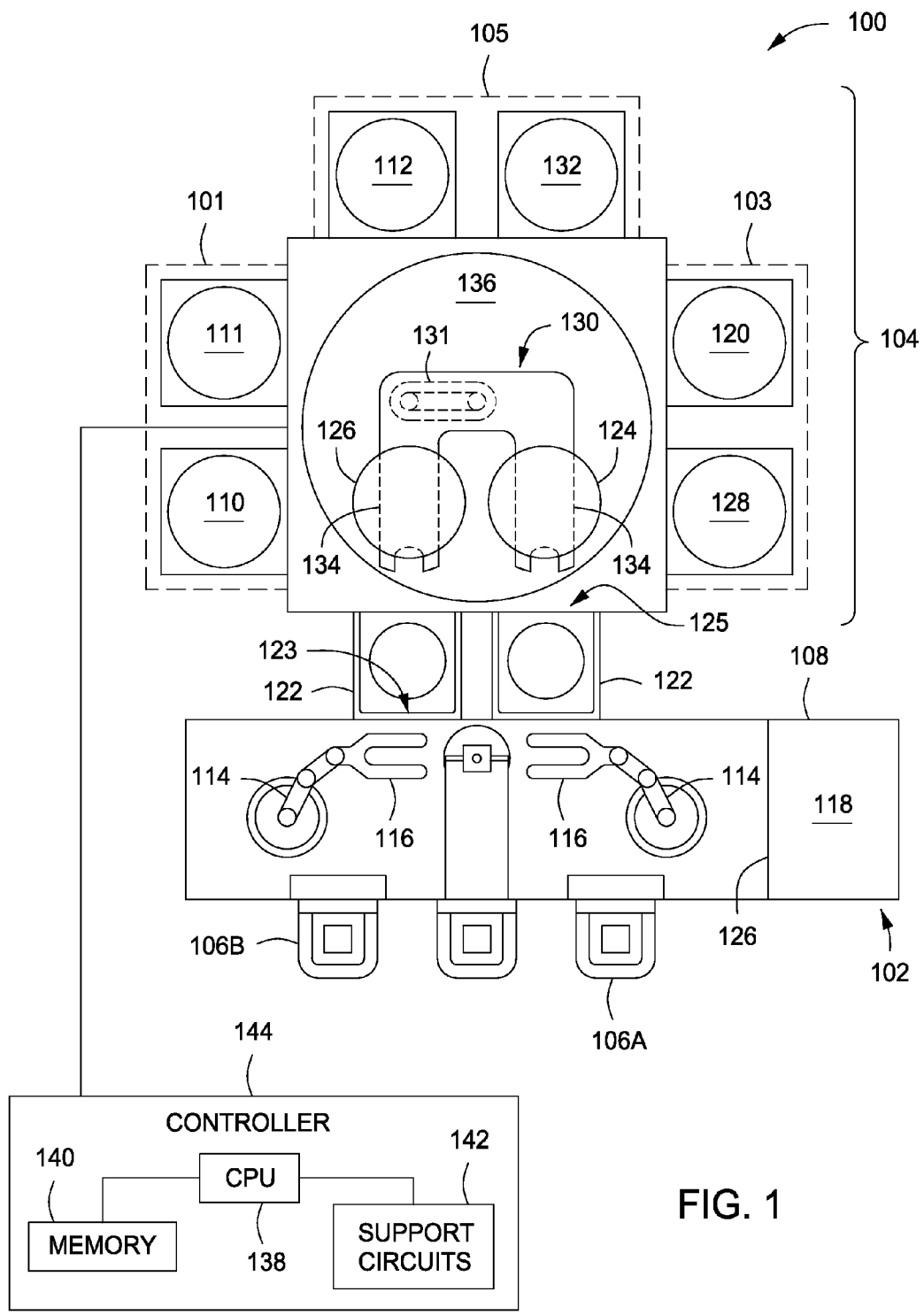
FIG. 1 depicts a schematic top view of a processing system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for processing substrates in a twin chamber processing system are disclosed herein. The inventive methods advantageous control operation of chamber processes, such process gas flow, plasma generation, and the like, when shared resources are used between each chamber of a twin chamber processing system, or other processing systems having two or more process chambers having shared resources, such that processes can be run simultaneously on substrates in each process chamber and process quality can be maintained.

An exemplary twin chamber processing system as disclosed herein may be a standalone processing system or a part of a cluster tool having several twin chamber processing systems coupled thereto, for example, such as a processing system 100 illustrated in FIG. 1. Referring to FIG. 1, in some embodiments, the processing system 100 may generally comprise a vacuum-tight processing platform 104, a factory interface 102, one or more twin chamber processing systems 101, 103, 105 and a system controller 144. Examples of a processing system that may be suitably modified in accordance with the teachings provided herein include the CENTURA® integrated processing system, one of the PRODUCER® line of processing systems (such as the PRODUCER® GT™), ADVANTEDGE™ processing systems, or other suitable processing systems commercially available from Applied Materials, Inc., located in Santa Clara, Calif. Other processing systems may be adapted to benefit from the invention. Although disclosed herein with reference to a twin chamber processing system, other multiple chamber processing systems (e.g., two or more) having shared resources may be modified and operated in accordance with the teachings provided herein. Another example of a twin chamber processing system is described in U.S. Provisional Patent Application Ser. No. 61/330,156, filed Apr. 30, 2010, by Ming Xu et al., and entitled, "Twin Chamber Processing System."

The platform 104 includes a vacuum substrate transfer chamber 136 having the one or more twin chamber processing systems 101, 103, 105 (three shown in FIG. 1) coupled thereto. Each twin chamber processing system includes two process chambers (e.g., 110 and 111, 112 and 132, and 120 and 128). The platform further includes at least one load-lock chamber 122 (two shown in FIG. 1) that are coupled to the vacuum substrate transfer chamber 136. The factory interface 102 is coupled to the transfer chamber 136 via the load lock chambers 122.

Each twin chamber processing system 101, 103, 105 includes independent processing volumes that may be isolated from each other. Each twin chamber processing system 101, 103, 105 may be configured to share resources (e.g., process gas supply, vacuum pump, or the like) between each process chamber of the twin chamber processing system as discussed below and illustrated in FIG. 2.

The factory interface 102 may comprise at least one docking station 108 and at least one factory interface robot (two shown in FIG. 1) 114 to facilitate transfer of substrates. The docking station 108 may be configured to accept one or more (two shown in FIG. 1) front opening unified pods (FOUPs) 106A-B. The factory interface robot 114 may comprise a blade 116 disposed on one end of the robot 114 configured to transfer the substrate from the factory interface 102 to the processing platform 104 for processing through the load lock chambers 122. Optionally, one or more metrology stations 118 may be connected to a terminal 126 of the factory interface 102 to facilitate measurement of the substrate from the FOUPs 106A-B.

Each of the load lock chambers 122 may comprise a first port 123 coupled to the factory interface 102 and a second port 125 coupled to the transfer chamber 136. The load lock chambers 122 may be coupled to a pressure control system (not shown) which pumps down and vents the load lock chambers 122 to facilitate passing the substrate between the vacuum environment of the transfer chamber 136 and the substantially ambient (e.g., atmospheric) environment of the factory interface 102.

The transfer chamber 136 has a vacuum robot 130 disposed therein. The vacuum robot 130 may include one or more transfer blades 134 (two shown in FIG. 1) coupled to a movable arm 131. For example, in some embodiments, where twin chamber processing systems are coupled to the transfer chamber 136 as shown, the vacuum robot 130 may comprise two parallel blades 134 configured such that the vacuum robot 130 may simultaneously transfer two substrates 124, 126 from the load lock chambers 122 to the process chambers of a twin chamber processing system, for example, process chambers 110, 111 of the twin chamber processing system 101. Alternatively, in some embodiments, the vacuum robot 130 may be configured to selectively provide a substrate 124 to one process chamber of the twin chamber processing system, for example, process chamber 110 of the twin chamber processing system 101. In such embodiments, in operation, the vacuum robot 130 may provide a substrate to only one of the process chambers, or may sequentially provide a first substrate to a first process chamber of the twin processing chamber system (e.g., provide substrate 126 to process chamber 111) followed by a second substrate to a second process chamber of the twin processing chamber system (e.g., provide substrate 124 to process chamber 110).

The process chambers 110, 111 or 112, 132 or 128, 120 of each twin chamber processing system 101, 103, 105 may be any type of process chamber utilized in substrate processing, for example, such as etch chambers, deposition chambers, or the like. In some embodiments, each process chamber of the twin chamber processing system is configured for the same function, for example, etching. For example, in embodiments where each process chamber of a twin chamber processing system is an etch chamber, each process chamber may include a plasma source, for example, an inductive or capacitively coupled plasma source, a remote plasma source or the like. Further, each process chamber of a twin chamber processing system may use a halogen-containing gas, for example, provided by a shared gas panel (as discussed below), to etch substrates (e.g., substrates 124, 126) disposed therein. Examples of halogen-containing gas include hydrogen bromide (HBr), chlorine ($Cl_2$), carbon tetrafluoride ($CF_4$), and the like. For example, after etching the substrates 124, 126, halogen-containing residues may remain on the substrate surface. The halogen-containing residues may be removed by a thermal treatment process in the load lock chambers 122, or by other suitable means.

Figure 2:
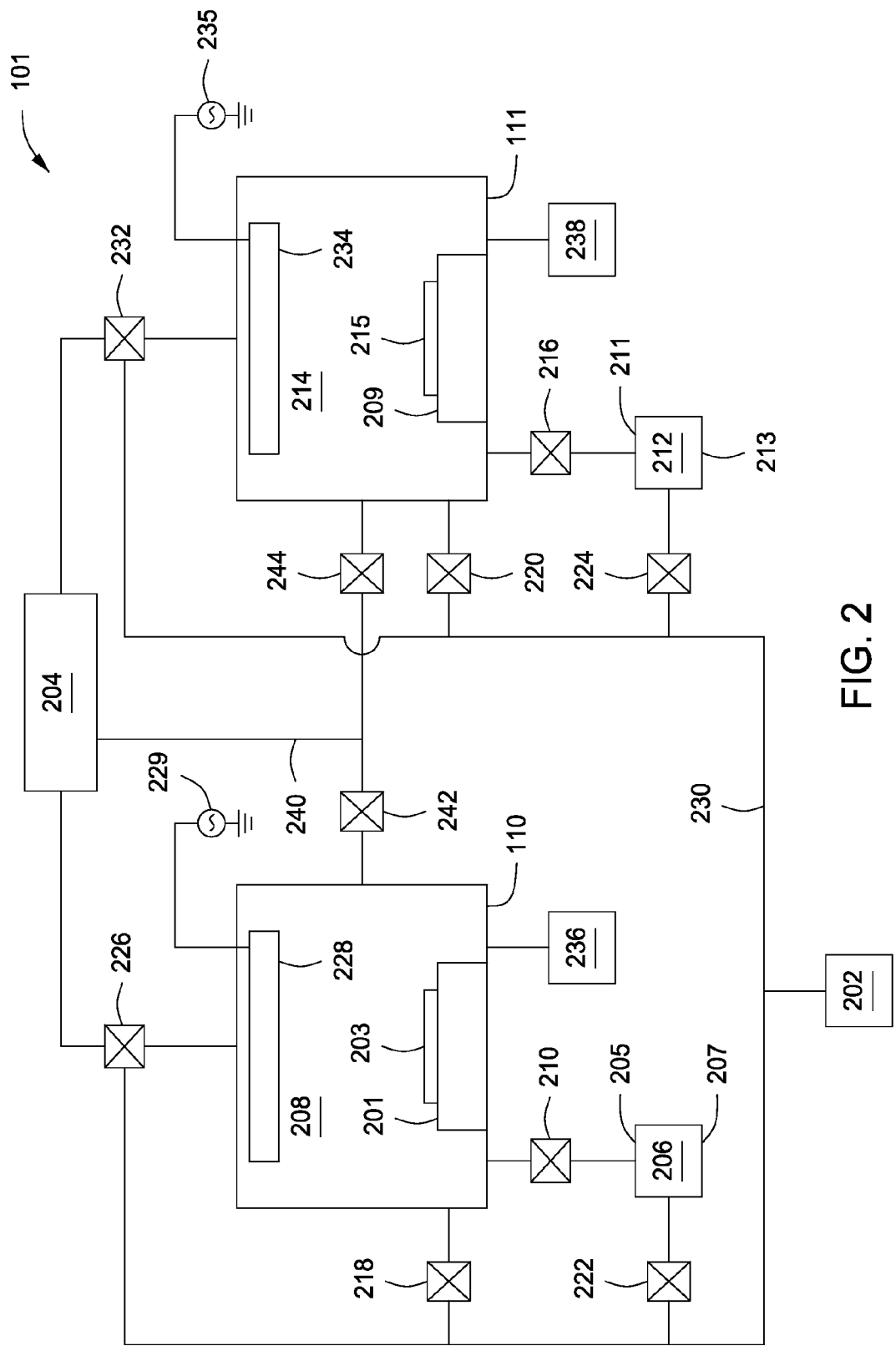
FIG. 2 depicts a schematic side view of a twin chamber processing system in accordance with some embodiments of the present invention.

FIG. 2 depicts a schematic side view of a twin chamber processing system, for example twin chamber processing system 101, in accordance with some embodiments of the present invention. The twin chamber processing system 101 includes the process chambers 110, 111, wherein the process chambers 110, 111 share resources, for example, such as a shared vacuum pump 202 and a shared gas panel 204 as shown in FIG. 2. In some embodiments, each twin chamber processing system coupled to the processing system 100 may be similarly configured.

The process chamber 110 (e.g., a first process chamber) has a first processing volume 208 that includes a first substrate support 201 disposed therein to support a substrate (first substrate 203 shown in FIG. 2). The process chamber 110 further includes a first vacuum pump 206 for maintaining a first operating pressure in the first processing volume 208. The first vacuum pump 206 may be, for example, a turbomolecular pump or the like. The first vacuum pump 206 may include a low pressure side 205 proximate the first processing volume 208 and a high pressure side 207 which may be selectively coupled to the shared vacuum pump 202 as discussed below. The first vacuum pump 206 may be selectively isolated from the first processing volume 208 by a first gate valve 210 disposed between the first processing volume 208 and the first vacuum pump 206, for example proximate the low pressure side 205 of the first vacuum pump 206.

The process chamber 111 (e.g., a second process chamber) of the twin chamber processing system 101 includes a second processing volume 214 having a second substrate support 209 disposed therein to support a substrate (second substrate 215 shown in FIG. 2). The process chamber 111 further includes a second vacuum pump 212 for maintaining a second operating pressure in the second processing volume 214. The second vacuum pump 212 may be, for example, a turbomolecular pump or the like. The second vacuum pump 212 may include a low pressure side 211 proximate the second processing volume 214 and a high pressure side 213 which may be selectively coupled to the shared vacuum pump 202 as discussed below. The second vacuum pump 212 may be selectively isolated from the second processing volume 214 by a second gate valve 216 disposed between the second processing volume 214 and the second vacuum pump 212, for example proximate the low pressure side 211 of the second vacuum pump 212.

The first and second processing volumes 208, 214 may be isolated from each other to facilitate substantially independent processing of substrates in each respective process chamber 110, 111. The isolated processing volumes of the process chambers within the twin chamber processing system advantageously reduces or eliminates processing problems that may arise due to multi-substrate processing systems where the processing volumes are fluidly coupled during processing. For example, in some embodiments, a substrate may be processed in one of the process chambers of the twin chamber processing system while the other process chamber remains idle. In such embodiments, the shared resources may be diverted from the idle process chamber and provided only to the process chamber having the substrate being processed therein. In some embodiments, the idle process chamber may be decoupled from the shared resources and/or disabled to allow for service operations (e.g. maintenance, cleaning, testing, monitoring, or the like) to be performed without affecting the process being performed in the other process chamber. Non-limiting examples of such service operations and methods of performing such services may be found in U.S. Provisional Patent Application Ser. No. 61/330,177, filed Apr. 30, 2010, by James P. Cruse et al., and entitled, "Methods for Monitoring Processing Equipment."

However, the twin chamber processing system further advantageously utilizes shared resources that facilitate reduced system footprint, hardware expense, utilities usage and cost, maintenance, and the like, while at the same time promoting higher substrate throughput. For example, shared hardware may include one or more of a process foreline and roughing pump, AC distribution and DC power supplies, cooling water distribution, chillers, multi-channel thermo controllers, gas panels, controllers, and the like.

The shared vacuum pump 202 may be selectively coupled to or isolated from any of the first and second processing volumes 208, 214 or the first and second vacuum pumps 206, 212. For example, the shared vacuum pump 202 may be coupled to the first and second processing volumes 208, 214 for reducing a pressure in each processing volume below a critical pressure level prior to opening the first and second gate valves 210, 216. For example, the critical pressure level may be a higher pressure than either of the first and second operating pressure provided by the first and second vacuum pumps 206, 212 respectively. However, the critical pressure level may be required for the first and second vacuum pumps 206, 212 to begin operation.

The shared vacuum pump 202 may be selectively coupled to the first processing volume 208 while bypassing the first vacuum pump 206 by a first roughing valve 218 disposed between the first processing volume 208 and the shared vacuum pump 202. For example, and as discussed in the methods below, the first vacuum pump 206 may be isolated from the first processing volume 208 by the first gate valve 210 while a pressure of the first processing volume 208 is lowered to below the critical pressure level, for example, suitable for operation of the first vacuum pump 206. Additional embodiments where the first vacuum pump 206 may be bypassed are also discussed below.

Similarly, the shared vacuum pump 202 may be selectively coupled to the second processing volume 214 while bypassing the second vacuum pump 212 by a second roughing valve 220 disposed between the second processing volume 214 and the shared vacuum pump 202. For example, and as discussed in the methods below, the second vacuum pump 212 may be isolated from the second processing volume 214 by the second gate valve 216 while a pressure of the second processing volume 214 is lowered to below the critical pressure level, for example, suitable for operation of the second vacuum pump 206. Additional method embodiments where the second vacuum pump 212 may be bypassed are also discussed below.

The shared vacuum pump 202 may be selectively coupled to the first vacuum pump 206 by a first isolation valve 222. For example, the first isolation valve 222 may be disposed between the high pressure 207 of the first vacuum pump 206 and the shared vacuum pump 202. In some embodiments, for example when the first vacuum pump 206 is in operation, the first isolation valve is open to allow gases or the like removed from the first processing volume 208 by the first vacuum pump 206 to be exhausted from the high pressure side 207 of the first vacuum pump 206 to the shared vacuum pump 202.

Similarly, the shared vacuum pump 202 may be selectively coupled to the second vacuum pump 212 by a second isolation valve 224. For example, the second isolation valve 224 may be disposed between the high pressure 213 of the second vacuum pump 212 and the shared vacuum pump 202. In some embodiments, for example when the second vacuum pump 212 is in operation, the second isolation valve is open to allow gases or the like removed from the second processing volume 214 by the second vacuum pump 212 to be exhausted from the high pressure side 213 of the second vacuum pump 212 to the shared vacuum pump 202.

The shared gas panel 204 may be coupled to each of the process chambers 110, 111 for providing one or more process gases to the first and second processing volumes 208, 214. For example, the shared gas panel may include one or more gases sources (not shown), for example where a gas from each gas source is metered out to each process chamber by one or more flow controllers, such as a mass flow controller, flow ratio controller or the like. Each gas source may be provided to each processing volume independently or to both processing volumes simultaneously, for example, to perform the same process in both process chambers 110, 111 simultaneously. As used herein, simultaneously means that the processes being performed in the two processing volumes at least partially overlap, begin after both substrates are delivered to the two processing volumes, and end prior to removal of either substrate from either of the two processing volumes.

A first three-way valve 226 can be disposed between the shared gas panel and the first processing volume 208 of the process chamber 110 to provide a process gas from the shared gas panel 204 to the first processing volume 208. For example, the process gas may enter the process chamber 110 at a first showerhead 228 or any suitable gas inlet(s) used for providing a process gas to a process chamber. Further, the first three-way valve 226 may divert the process gas from the shared gas panel 204 (e.g., bypassing the first processing volume 208) into a foreline conduit 230 coupled to the shared vacuum pump 202. Further, as shown, the foreline conduit 230 may couple the shared vacuum pump 202 to the high pressure side 207 of the first vacuum pump 206 and directly couple the shared vacuum pump 202 to the first processing volume 208.

The first showerhead 228 may include an electrode having a first RF power source 229 coupled thereto, for example, for striking a plasma in the first processing volume 208 from a process gas. Alternatively, the first RF power source 229 may be coupled to an electrode separate from the first showerhead 228 (not shown) or coupled to one or more inductive coils (not shown) disposed outside the first processing volume 208.

A second three-way valve 232 can be disposed between the shared gas panel 204 and second processing volume 208 of the process chamber 111 to provide a process gas from the shared gas panel 204 to the second processing volume 208. For example, the process gas may enter the process chamber 111 at a second showerhead 234 or any suitable gas inlet(s) used for providing a process gas to a process chamber. Further, the second three-way valve 232 may divert the process gas from the shared gas panel 204 (e.g., bypassing the second processing volume 214) into the foreline conduit 230 coupled to the shared vacuum pump 202. Further, as shown, the foreline conduit 230 may couple the shared vacuum pump 202 to the high pressure side 213 of the second vacuum pump 212 and directly couple the shared vacuum pump 202 to the second processing volume 214.

The second showerhead 234 may include an electrode having a second RF power source 235 coupled thereto, for example, for striking a plasma in the second processing volume 214 from a process gas. Alternatively, the second RF power source 235 may be coupled to an electrode separate from the second showerhead 234 (not shown) or coupled to one or more inductive coils (not shown) disposed outside the second processing volume 214.

In some embodiments, for example where a substrate is processed in only one of the process chambers of the twin chamber processing system while the other process chamber remains idle, the first and second three-way valves 226, 232 may be used to divert the process gases away from the idle process chamber and to the foreline conduit 230. Diverting the processes gases away from the idle process chamber may prevent the process gases from condensing on one or more interior surfaces or components (e.g., interior walls, substrate support, gas lines, or the like), thereby reducing or eliminating contamination, corrosion, particle formation, or the like that may result from the condensation of the process gases.

The first and second three-way valves 226, 232 may operate in response to a process endpoint detected, for example, by a first endpoint detector 236 for detecting the process endpoint in the process chamber 110 and by a second endpoint detector 238 for detecting the process endpoint in the process chamber 111. The first and second endpoint detectors 236, 238 may be configured to determine an endpoint by optical emission spectroscopy (OES), interferometry, or other suitable means of endpoint detection. In some embodiments, the first and second endpoint detectors 236, 238 may be part of a process controller and may be configured to determine an endpoint by elapsed time based upon empirical or modeled calculations. In some embodiments, the process endpoint time may be part of a process recipe in the process controller and, in some embodiments, may be adjusted via advanced process control techniques (such as, incoming film or substrate variations, feedback and/or feedforward information, or the like). For example, a controller, for example such as the system controller 144 or a individual controller (not shown) coupled to one or more of the components of the twin chamber processing system 101, may be configured to receive a first signal form the first endpoint detector 236 when the process endpoint is reached in the process chamber 110 and to terminate the process, for example, by instructing the first three-way valve 226 to divert a process gas into the foreline conduit 230 and/or by turning off the RF power to the process chamber, if the process endpoint has not been reached in a process running in the process chamber 111. For example, although a process may be synchronized in each process chamber 110, 111 initially, the process may end at different times in each process chamber 110, 111 due to, for example, small variations in a substrate being processed, substrate temperature, plasma density or flux, or the like in each process chamber 110, 111. In addition, process endpoints in each chamber may vary, for example, due to any one or more of: substrate variation between process chambers, upstream processing prior to entering each process chamber 110, 111, feedforward control to correct substrate variations due to upstream processing, feedback control to adjust process parameters in response to downstream processing, or the like. Similarly, the controller may be configured to receive a second signal from the second endpoint detector 238 when the process endpoint is reached in the process chamber 111 and to instruct the second three-way valve 232 to divert a process gas into the foreline conduit 230 if the process endpoint has not been reached in a process running in the process chamber 110.

Alternatively or in combination, and as discussed in the method 300 below, when an endpoint is reached in either process chamber 110, 111 as determined by the respective first and second detectors 236, 238, the controller 144 may shut off a plasma in each process chamber 110, 111 by turning off the respective first and second RF power sources 231, 235. When each RF power source is turned off, the process gas may continue to flow to each process chamber, or the process gas flow may be turned off along with each RF power source, or the process gas may be diverted by each three-way valve as discussed above.

Alternatively, a process need not be precisely synchronized in both process chambers 110, 111 and for example may begin in each chamber when a substrate has reached the appropriate process temperature or another similar process condition. Accordingly, when a process endpoint is reach in a given chamber, the process gas is diverted by a three-way valve into the foreline conduit 230 until the process endpoint is reached in the adjacent chamber prior to removing the substrates from the chambers 110, 111 or prior to beginning a further processing step.

The shared gas panel may further provide a gas for purging the process chambers 110, 111. For example, a vent line 240 may be selectively coupled to each of the first and second processing volumes 208, 214 either directly (as shown) or via the high pressure sides 207, 213 of respective first and second vacuum pumps 206, 212 (not shown). For example, the purge gas may include nitrogen ($N_2$), argon (Ar), helium (He), or the like. The purge gas may be selectively provided to the first processing volume 208 via a first purge valve 242 disposed between the shared gas panel 204 and the first processing volume 208. Similarly, the purge gas may be selectively provided to the second processing volume 214 via a second purge valve 244 disposed between the shared gas panel 204 and the second processing volume 214. Further, in applications where the purge gas is utilized to vent each process chamber 110, 111 to atmosphere, a vent (not shown), for example such as a valve or the like, may be provided for each chamber 110, 111 such that each chamber 110, 111 may be vented to atmosphere independently from the other chamber.

Returning to FIG. 1, the system controller 144 is coupled to the processing system 100. The system controller 144 controls the operation of the system 100 using a direct control of the process chambers 110, 111, 112, 132, 128, 120 of the system 100 or alternatively, by controlling individual controllers (not shown) associated with the process chambers 110, 111, 112, 132, 128, 120 and/or each twin chamber processing system 101, 103, 105 and the system 100. In operation, the system controller 144 enables data collection and feedback from the respective chambers and system controller 144 to optimize performance of the system 100. In some embodiments, the system controller 144 may individually control each process chamber (e.g., process chambers 110, 111, 112, 132, 128, 120) within each twin chamber processing system (e.g., twin chamber processing system 101, 103, 105) independent of one another. For example, in some embodiments, neither, one, or both of the process chambers within each twin chamber processing system may be utilized to process a substrate regardless of the processing state of the other process chamber within that particular twin chamber processing system. In such embodiments, the system controller 144 may be configured to support automated substrate handling regardless of the state of either or both of the process chambers of the twin chamber processing system.

The system controller 144 generally includes a central processing unit (CPU) 138, a memory 140, and support circuit 142. The CPU 138 may be one of any form of a general purpose computer processor that can be used in an industrial setting. The support circuits 142 are conventionally coupled to the CPU 138 and may comprise cache, clock circuits, input/output subsystems, power supplies, and the like. The software routines, such as a method 300 or 400 described below for controlling one or more chamber processes, such as reducing pressure, venting or purging each chamber of a twin chamber processing system, when executed by the CPU 138, transform the CPU 138 into a specific purpose computer (controller) 144. The software routines may also be stored and/or executed by a second controller (not shown) that is located remotely from the system 100.

Figure 3:
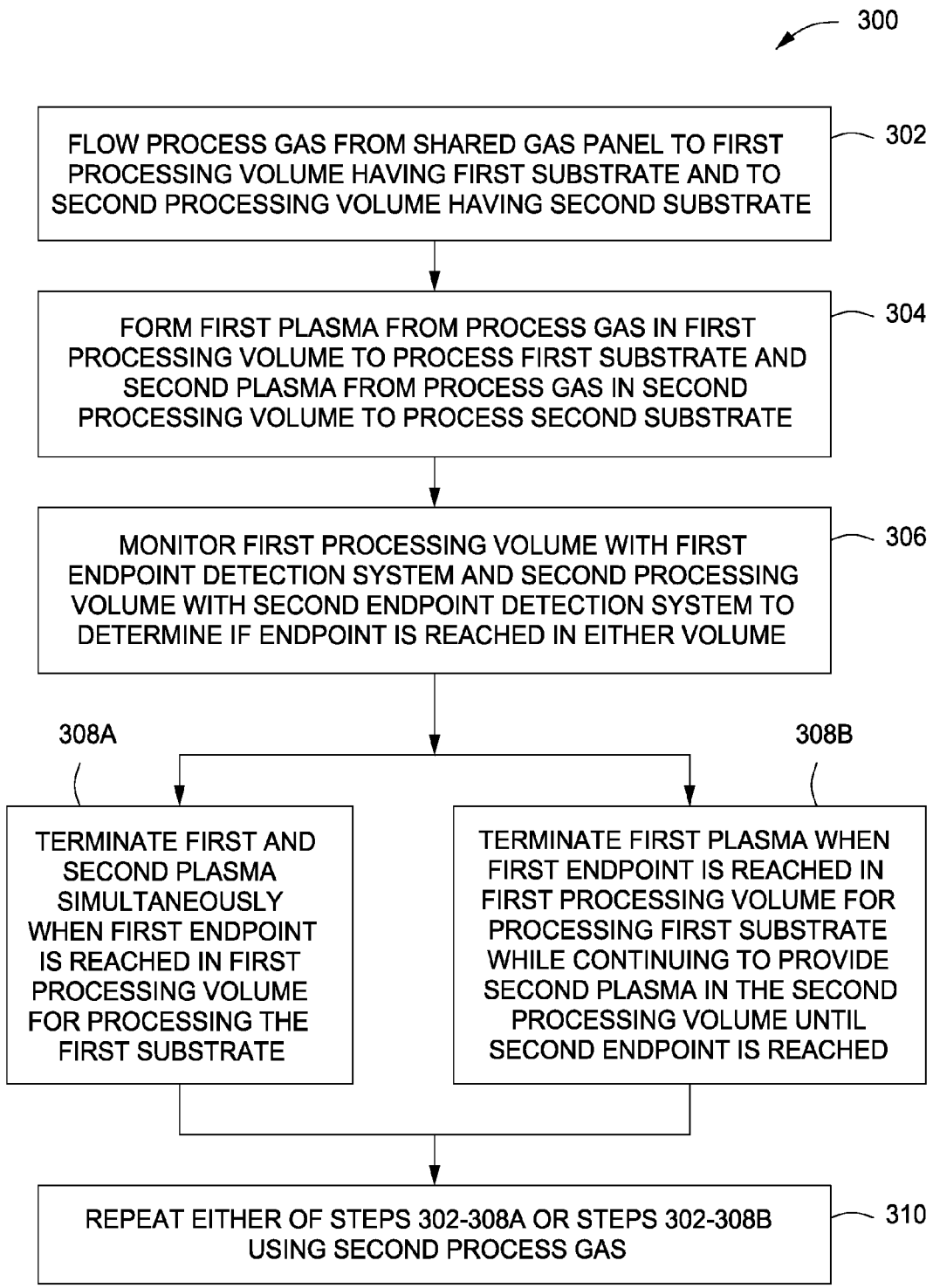
FIGS. 3 and 4 depict flow charts for methods of processing substrates in a twin chamber processing system in accordance with some embodiments of the present invention.

A method 300 for processing substrates in the process chambers of a twin chamber processing system is depicted in FIG. 3 and described below with respect to the twin chamber processing system 101 depicted in FIG. 2. Further, the inventive methods disclosed herein need not be limited to only two process chambers sharing common resources, such as the twin chamber processing system 101. For example, the inventors contemplate that processing systems having three or more process chambers which shared common resources (not shown) may benefit from the inventive methods disclosed herein. The inventive method facilitates the operation of individual process chambers having shared resources according to their own individual requirements, while enabling synchronization of shared resources, such as a shared gas panel, that provides resources to multiple process chambers. For example, a shared resource (such as process gases) may be provided to all process chambers. As soon as any process chamber is ready for processing, a plasma may be formed by providing RF to begin processing. When the process is done, the process may be terminated (for example, by turning off RF power) and the process chamber may wait until all other process chambers coupled to the shared resource are finished processing. Upon completion of processing by all process chambers, the shared resource may be set at desired for a next step and the cycle may continue. Thus, the individual process chambers can run independently while the shared resource is in a given state, and the process chambers may wait until all process chambers are ready for the next transition of the shared resource to a new state desired for subsequent processing.

The method 300 begins at 302 by flowing a process gas from the shared gas panel 204 of the twin chamber processing system 101 to the first processing volume 208 of the process chamber 110 having the first substrate 203 disposed therein and to the second processing volume 214 of the process chamber 111 having the second substrate 215 disposed therein. For example, the first three-way valve 226 and the second three-way valve 232 may be configured to provide the process gas to the first and second showerheads 228, 234 respectively such that the process gas enters the first and second processing volumes 208, 214.

At 304, a first plasma may be formed from the process gas in the first processing volume 208 to process the first substrate 203 and a second plasma may be formed from the process gas in the second processing volume 214 to process the second substrate 215. For example, the first plasma may be formed by providing RF power from the first RF power source 229 to first processing volume 208 to form the first plasma from the process gas. Similarly, the second plasma may be formed by providing RF power from the second RF power source 235 to the second processing volume 214 to from the second plasma for the process gas.

A process performed in the process chambers 110, 111 may be synchronized or unsynchronized. In a synchronized process, processing does not occur in either chamber until both chambers have reached a desired state to form the plasma and begin processing. In an unsynchronized process, processing may begin in either chamber as soon as the particular chamber has reached a desired state to form the plasma and begin processing. For example, in some embodiments, at least one of heating the first and second substrates 203, 215 to a substantially similar temperature, providing a substantially similar pressure in both the first and second processing volumes 208, 214, or providing a substantially similar flow rate of the process gas to both the first and second processing volumes 208, 214 occurs prior to forming the first and second plasmas. Accordingly, by attempting to substantially equilibrate one or more processing conditions in both process chambers 110, 111, the process chambers 110, 111 may be synchronized prior to forming the first and second plasma in the process chambers 110, 111. Synchronizing the process conditions in the process chambers 110, 111 may be utilized such that a first endpoint for processing the first substrate 203 may be reached at about the same time as a second endpoint for processing the second substrate 215. However, in some embodiments, even if the process conditions are synchronized, the first and second endpoints may be reached at different times.

Alternatively, the first plasma may be formed from the process gas prior to the second plasma. For example, at least one of the first processing volume 208 reaches at least one of an operating pressure or operating flow rate of the process gas prior to second processing volume 214, or the first substrate 203 reaches an operating temperature prior to the second substrate 215. Accordingly, due to the processing conditions being reached in the process chamber 110 prior to the process chamber 111, the first plasma may be formed prior to the second plasma. Accordingly, when the process conditions are unsynchronized, the first endpoint for processing the first endpoint for processing the first substrate 203 may be reached prior to the second endpoint for processing the second substrate 215.

At 306, the first processing volume 208 may be monitored with the first endpoint detection system 236 and the second processing volume 214 may be monitored with a second endpoint detection system 238 to determine if a process endpoint is reached in either processing volume. For example, the process endpoint may be determined by monitoring one or more of a critical concentration of the process gas, a material from the first and second substrates or a byproduct from a reaction between the first and second substrates and the process gas and/or first and second plasmas. For example, the process endpoint may be determined by optical measurement or any suitable means for detecting any of the aforementioned process endpoints.

At 308, the method 300 may proceed by either of two alternatives, 308A or 308B, where the processes in the first and second process chambers 110, 111 are terminated either simultaneously or sequentially and either upon reaching the first process endpoint or the second process endpoint. The decision of whether or not to terminate the first-endpoint reached process may be made based at least in part upon the selectivity of the process being performed. For example, if an etch process is being performed in each process chamber 110, 111 and the process is highly selective (e.g., the etch process does not etch a mask and/or materials underlying the desired material being etched, or etches such materials at a comparatively low rate), then a decision may be made to continue processing in the chamber until the second process endpoint is reached. In such a scenario, continuing the first process may not present much risk of defect or damage to the substrate or structures being formed thereon due to the high selectivity of the process. One the other hand, where the selectivity is low (e.g., the etch process etches the mask and/or materials underlying the desired material being etched at a rate near the etch rate of the desired material being etched), then a decision may be made to terminate processing in the chamber immediately upon reaching the process endpoint. In such a scenario, continuing the first process may present a high risk of defect or damage to the substrate or structures being formed thereon due to the low selectivity of the process.

At 308A, when a first endpoint is reached in the first processing volume 208 for processing the first substrate 203, the first and second plasma may be simultaneously terminated. For example, the flow of the process gas may be stopped at the shared gas panel 204, or the flow of the process gas may be diverted to the foreline conduit 230 by both the first and second three-way valves 226, 232, the first and second RF power sources 229, 235 may be turned off, or any combinations thereof.

In some embodiments, the first endpoint may be reached prior to a second endpoint in the second processing volume 214 for processing the second substrate 215. Accordingly, the first and second plasmas can be terminated based upon the first endpoint being an earlier endpoint than the second endpoint. Alternatively, in some embodiments, the first endpoint may be reached after the second endpoint in the second processing volume 214. Accordingly, the first and second plasmas can be terminated based upon the first endpoint being a later endpoint than the second endpoint. In some embodiments, the first endpoint may be reached about simultaneously with the second endpoint in the second processing volume 214 for processing the second substrate. Thus, according to 308A, both plasmas are terminated about simultaneously, and may be terminated upon the first endpoint being detected (or both endpoints being about simultaneously detected) or upon the last endpoint being detected.

Alternatively, at 308B, when the first endpoint is reached in the first processing volume 208 for processing the first substrate 203, the first plasma may be terminated while continuing to provide the second plasma in the second processing volume 214 until the second endpoint is reached for processing the second substrate 215. For example, the first plasma may be terminated in any suitable manner, such as turning off the RF power source 231. In some embodiments, RF power provided to the first processing volume 208 by the first RF power source 229 may be turned off while continuing to flow the process gas to the first processing volume 208 after the RF power provided by the first RF power source 229 is terminated. In some embodiments, the flow of the process gas to the first processing volume 208 may continue until the second endpoint is reached.

In some embodiments, RF power provided to the first processing volume 208 by the first RF power source 229 may be turned off and the process gas may be diverted prior to entering the first processing volume 208 when the RF power provided by the first RF power source 229 is terminated. For example, the three-way valve 226 may be used to divert the process gas into the foreline conduit 230. In some embodiments, the process gas may be diverted into the foreline conduit 230 by the three-way valve 226 until the second endpoint is reached for processing the second substrate 215.

After the second endpoint is reached for processing the second substrate 215 in the second processing volume 214, the second plasma may be terminated. For example, the second plasma may be terminated by any of the methods discussed above for terminating the first plasma, such as diverting the process gas into the foreline conduit 230 using the three-way valve 232 or the like. The method similarly proceeds if the second endpoint is reached prior to the first endpoint being detected. Thus, at 308B, the first and second plasmas are treated independently and extinguished solely upon the process endpoint being detected for the particular process chamber. For example, if an etch process is being performed in each process chamber 110, 111 simultaneously, where the etch process is highly selective, for example where a first material of the substrate is etched a substantially faster rate than a second material of the substrate, then the first and second plasmas can be terminated when the first and second endpoints are individually reached in each process chamber 110, 111.

Optionally, at 310, 302-308A or 302-308B may be repeated with a second process gas to further process the first and second substrates 203, 215. For example, if 302-308A were used to process the first and second substrates 203, 215 with the process gas, either of 302-308A or 302-308B may be used to further process the first and second substrates 203, 215. Similarly, if the steps 302-308B were used to process the first and second substrates 203, 215 with the process gas, either steps 302-308A or 302-308B may be used to further process the first and second substrates 203, 215. The repeated processing may occur, for example, for multiple sub-steps of a multiple step recipe, or for multiple etch processes that may be performed on a substrate in a single chamber. In addition, upon completion of the processing of both substrates in both process chambers, the substrates may be removed by the substrate transfer robot and delivered to another process chamber or to the load lock chambers for removal from the processing system. Subsequently, new first and second substrates may be placed in the respective process chambers by the substrate transfer robot, either from different process chambers in the processing system or from the factory interface via the load lock chambers, to begin processing. The method 300 described above may then be repeated for the new first and second substrates.

Further, and as discussed above, in each process where the shared resource is in the same state, for example when the shared resource is providing the first process gas to each process chamber 110, 111 as discussed above, each process chamber may operate independently, for example where the first and second plasmas are selectively terminated when the first and second endpoints are independently reached in each chamber. Alternatively, other examples of independent operation of each process chamber 110, 111 when the shared resource is in the same state, may include running different processes, such as plasma or non-plasma processes, or adjusting process conditions in each chamber such as substrate temperature, flow rate, RF power intensity or the like based upon feedforward or feedback control based on substrate variations, chamber variations or the like. After each chamber 110, 111 has completed a process in synchronization or having independently terminating endpoints, the process chambers 110, 111 may be synchronized again, for example, when switching the shared resource to a new state, for example when the shared resource is providing the second process gas to each process chamber 110, 111 as discussed above.

Figure 4:
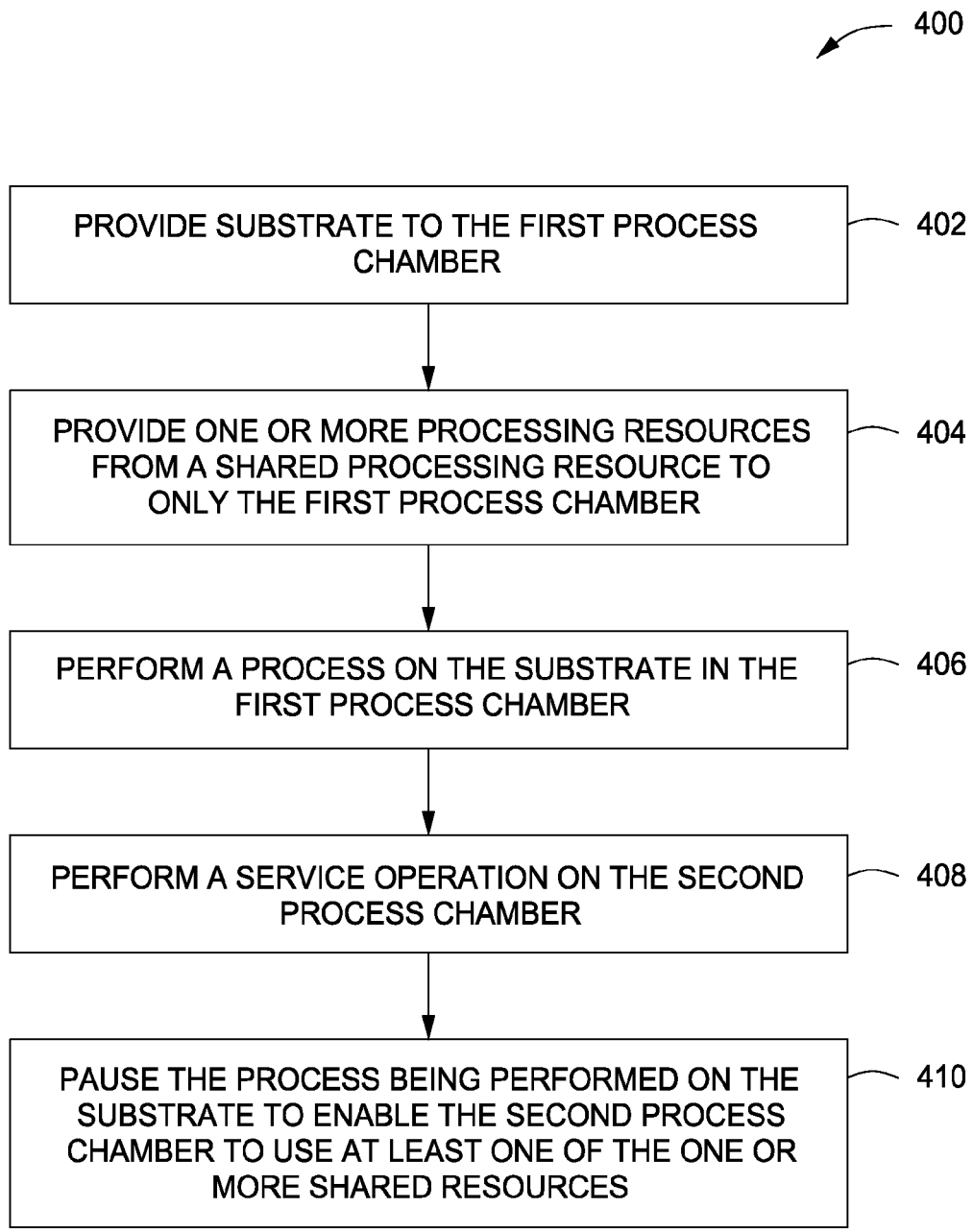

Although some of the above methods have been described with respect to simultaneously performing a synchronized or unsynchronized process on a first and second substrate 203, 215 in a respective first and second process chamber 110, 111 of a twin processing system 101, it is to be understood that the above processes may be performed on a single substrate disposed in only one of the first process chamber 110 or the second process chamber 111. For example, FIG. 4 depicts such a method 400.

In some embodiments, the method 400 may begin at 402 by providing a substrate (e.g., substrate 203) to the first process chamber 110 (or the second process chamber 111) of the twin processing system 101. The substrate 203 may be provided to the process chamber (i.e., process chamber 111 or 110) via, for example, a transfer robot, such as the vacuum robot 130 described above. The method described herein arbitrarily is illustrated with respect to providing the substrate to the first process chamber. However, the substrate could also be provided to the second process chamber instead.

Next, at 404, one or more processing resources from a shared processing resource may be provided to the substrate containing process chamber. The shared processing resource may be any resource suitable for substrate processing, for example, such as the shared gas panel 204 or the shared vacuum pump 202 described above. In some embodiments, for example, where the shared processing resource is a shared gas panel 204, the shared gas panel 204 may provide a process gas to the substrate containing process chamber to be formed into a plasma, such described above. In such embodiments, the shared gas panel 204 may provide the process gas at a flow rate suitable for both the first and second process chamber 110, 111. In some embodiments, one or more valves (e.g., the first and second three-way valves 226, 232) may be used to divert the process gases away from the non-substrate containing process chamber, for example, to a foreline conduit (e.g., foreline conduit 230) of the substrate containing process chamber. Diverting the processes gases away from the non-substrate containing process chamber may prevent the process gases from condensing on one or more interior surfaces or components (e.g., interior walls, substrate support, gas lines, or the like), thereby reducing or eliminating contamination, corrosion, particle formation, or the like that may result from the condensation of the process gases.

Next, at 406, a process is performed on the substrate in the substrate containing process chamber. The process may be any process that may be performed on a substrate, for example, such as an etch, deposition, anneal, or the like. In some embodiments, the process may be similar to the plasma process described above with respect to FIG. 3.

In some embodiments, while the process is being performed on the substrate at 406, the non substrate containing process chamber may sit idle. Alternatively, in some embodiments, at 408, a service operation may be optionally performed on the non substrate containing process chamber. The service operation may be any type of operation, for example such as maintenance, cleaning, testing, monitoring, or the like. Non-limiting examples of such service operations and methods of performing such services may be found in U.S. Provisional Patent Application Ser. No. 61/330,177, filed Apr. 30, 2010, by James P. Cruse et al., and entitled, "Methods for Monitoring Processing Equipment." In some embodiments, the non substrate containing process chamber may be decoupled from the shared resources and/or disabled to allow for service operations to be performed without affecting the process being performed in the other process chamber.

In some embodiments, while the process is being performed on the substrate at 406, a process requiring one or more of the shared resources may be started in the non substrate containing process chamber. The process may be any process, for example, such as the service operations or substrate processes described above. However, providing the one or more of the shared resources to the non substrate containing process chamber while the process is being performed on the substrate may cause the one or more of the shared resources to be delayed or otherwise provided in an inconsistent manner, thereby causing non-uniformities in the process being performed on the substrate. Accordingly, in some embodiments, at 410, in some embodiments, the process being performed on the substrate 203 may optionally be paused to allow the non substrate containing process chamber the use of the one or more shared resources. After the one or more shared resources is provided to the non substrate containing process chamber, the process in the substrate containing process chamber may resume.

After the process is performed at 406, the method generally ends. The substrate may proceed for further processing or may be removed from the process chamber. Alternatively, in some embodiments, a subsequent substrate may be provided to the process chamber and the method may repeat.

Thus, methods for processing substrates in a twin chamber processing system are disclosed herein. The inventive methods advantageously control operation of chamber processes, such process gas flow, plasma generation, and the like, when shared resources are used between each chamber of the twin chamber processing system, such that processes can be run simultaneously on substrates in each process chamber of the twin chamber processing system and process quality can be maintained.

While the foregoing is directed to embodiments of the present invention, other and further embodiments of the invention may be devised without departing from the basic scope thereof.

The invention claimed is:

1. A method of processing substrates in a twin chamber processing system having a first process chamber, a second process chamber, and shared processing resources, comprising:
    providing a substrate to the first process chamber of the twin chamber processing system, wherein the first process chamber has a first processing volume that is independent from a second processing volume of the second process chamber;
    providing one or more processing resources from the shared processing resources to only the first processing volume of the first process chamber; and
    performing a process on the substrate in the first process chamber while providing the one or more processing resources to only the first processing volume.

2. The method of claim 1, wherein the shared processing resources comprise at least one of a shared gas panel or a shared vacuum pump.

3. The method of claim 1, wherein providing one or more processing resources comprises providing a process gas from a shared gas panel, wherein the process gas bypasses the second process chamber.

4. The method of claim 3, wherein the process gas bypassing the second process chamber is diverted to a foreline of the first process chamber.

5. The method of claim 1, further comprising:
    performing a service operation on the one of the first process chamber or the second process chamber the substrate has not been provided to.

6. The method of claim 5, wherein performing a service operation comprises:
    performing at least one of a maintenance, cleaning, testing or monitoring process.

7. The method of claim 5, further comprising:
    simultaneously performing the process on the substrate in the first process chamber and the service operation on the second process chamber.

8. The method of claim 1, further comprising:
    pausing the process being performed on the substrate to enable the second process chamber to use at least one of the one or more shared resources.

9. A method of processing substrates in a twin chamber processing system having a first process chamber, a second process chamber, and shared processing resources, wherein the shared processing resources comprise at least one of a shared gas panel or a shared vacuum pump, the method comprising:

providing a substrate to the first process chamber of the twin chamber processing system, wherein the first process chamber has a first processing volume that is independent from a second processing volume of the second process chamber;

providing a process gas from a shared gas panel to only the first processing volume of the first process chamber, wherein the process gas bypasses the second process chamber and is diverted to a foreline of the first process chamber; and performing a process on the substrate in the first process chamber while providing the process gas to only the first processing volume.

10. A non-transitory computer readable medium, having instructions stored thereon which, when executed, causes a twin chamber processing system having a first process chamber, a second process chamber, and shared processing resources to perform a method, comprising:

providing a substrate to the first process chamber of the twin chamber processing system, wherein the first process chamber has a first processing volume that is independent from a second processing volume of the second process chamber;

providing one or more processing resources from the shared processing resources to only the first processing volume of the first process chamber; and performing a process on the substrate in the first process chamber while providing the one or more processing resources to only the first processing volume.

11. The non-transitory computer readable medium of claim 10, wherein providing one or more processing resources comprises providing a process gas from a shared gas panel, wherein the process gas bypasses the second process chamber.

12. The non-transitory computer readable medium of claim 11, wherein the process gas bypassing the second process chamber is diverted to a foreline of the first process chamber.

13. The non-transitory computer readable medium of claim 10, further comprising
performing a service operation on the second process chamber.

14. The non-transitory computer readable medium of claim 13, wherein performing a service operation comprises:
performing at least one of a maintenance, cleaning, testing, or monitoring process.

15. The non-transitory computer readable medium of claim 10, further comprising:
simultaneously performing the process on the substrate in the first process chamber and the service operation on the second process chamber.

16. The non-transitory computer readable medium of claim 10, further comprising:
pausing the processing being performed on the substrate to enable the second process chamber to use at least one of the one or more shared resources.

* * * * *